(12) United States Patent
Chan et al.

(10) Patent No.: US 6,650,264 B1
(45) Date of Patent: *Nov. 18, 2003

(54) QUADRATURE SAMPLING ARCHITECTURE AND METHOD FOR ANALOG-TO-DIGITAL CONVERTERS

(75) Inventors: Brian P. Lum Shue Chan, Austin, TX (US); Brian D. Green, Austin, TX (US); Donald A. Kerth, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/414,209

(22) Filed: Oct. 7, 1999

Related U.S. Application Data

(60) Provisional application No. 60/123,634, filed on Mar. 10, 1999.

(51) Int. Cl.[7] ............... H03M 3/00; H03H 7/30; H03H 7/40; H03K 5/159
(52) U.S. Cl. ............... 341/143; 375/235
(58) Field of Search ............... 341/143, 155; 329/341, 323; 327/74, 254; 375/147, 322, 235, 340, 332, 343, 261, 298, 302; 708/323, 300; 367/812

(56) References Cited

U.S. PATENT DOCUMENTS

| | | |
|---|---|---|
| 3,740,655 A | 6/1973 | Dickey, Jr. |
| 4,779,054 A * | 10/1988 | Monteleone et al. ....... 329/323 |
| 4,888,557 A | 12/1989 | Puckette, IV et al. |
| 5,422,909 A | 6/1995 | Love et al. |
| 5,454,007 A | 9/1995 | Dutta |
| 5,548,618 A * | 8/1996 | Sehier et al. ............... 375/343 |
| 5,621,345 A | 4/1997 | Lee et al. |
| 5,841,811 A | 11/1998 | Song |
| 5,912,828 A * | 6/1999 | Mondal et al. ............. 708/323 |
| 5,937,013 A | 8/1999 | Lam et al. |
| 5,952,947 A * | 9/1999 | Nussbaum et al. ......... 341/143 |
| 6,225,928 B1 * | 5/2001 | Green ........................ 341/143 |

FOREIGN PATENT DOCUMENTS

| | | | |
|---|---|---|---|
| EP | 535638 | * | 4/1993 |
| EP | 876031 | * | 11/1998 |

* cited by examiner

*Primary Examiner*—Patrick Wamsley
(74) *Attorney, Agent, or Firm*—Steven Lin, Esq.

(57) ABSTRACT

Quadrature sampling architecture and method are disclosed for analog-to-digital converters that provide improved digital output signals over prior quadrature mixing implementations. Sampling circuitry according to the present invention samples an input signal with a first and second sampling signals to produce real and imaginary sampled output signals. The first sampling signal, which is associated with the real sampled output signal, is delayed by one-fourth cycle with respect to the second sampling signal, which is associated with the imaginary sampled output signal. This one-fourth cycle sampling signal difference allows for simplified construction of the sampling circuitry. In addition, filter circuitry according to the present invention processes the real and imaginary digital data output signals so that the imaginary digital data output signal is advanced by one-fourth cycle with respect to the real digital data output signal. This one-fourth cycle relative advance tends to eliminate undesirable magnitude distortion and error signals in complex digital output signals that have been mixed down to baseband. Furthermore, the real and imaginary signal paths may be interchanged and still take advantage of the present invention.

22 Claims, 3 Drawing Sheets

QUADRATURE SAMPLING ARCHITECTURE AND METHOD FOR ANALOG-TO-DIGITAL CONVERTERS

This application claims priority from Provisional Application Ser. No. 60/123,634 which was filed Mar. 10, 1999.

This application is related to the following U.S. patent applications that have been previously filed on Mar. 10, 1999, and that are hereby incorporated by reference in their entirety: Ser. No. 09/265,663, entitled "Method and Apparatus for Demodulation of Radio Data Signals" by Eric J. King and Brian D. Green.; Ser. No. 09/266,418, entitled "Station Scan Method and Apparatus for Radio Receivers" by James M. Nohrden and Brian P. Lum Shue Chan; Ser. No. 09/265,659, entitled "Method and Apparatus for Discriminating Multipath and Pulse Noise Distortions in Radio Receivers" by James M. Nohrden, Brian D. Green and Brian P. Lum Shue Chan; Ser. No. 09/265,752, entitled "Digital Stereo Recovery Circuitry and Method For Radio Receivers" by Brian D. Green; and Ser. No. 09/265,758, entitled "Complex Bandpass Modulator and Method for Analog-to-Digital Converters" by Brian D. Green.

BACKGROUND OF THE INVENTION

1. Field of the Invention

The present invention relates generally to sampling architectures for analog-to-digital converters. More specifically, the present invention relates to techniques for providing complex sampled values for delta-sigma analog-to-digital converters.

2. Description of the Related Art

Many devices utilize analog-to-digital converters (ADCs) to convert analog information to digital information so that signal processing may be accomplished on the digital side. An intermediate frequency (IF) digital receiver within an AM/FM radio is one example of a device that has a use for such an ADC. In particular, delta-sigma ADCs are useful in providing digital information that may be further processed by digital signal processing. The signals processed by a delta-sigma ADC are often complex signals including both an in-phase (real) and a quadrature (imaginary) signal data paths. In such signal processing systems, the complex input signals are typically sampled at some desired sampling frequency to ultimately produce a real digital data stream and an imaginary digital data stream.

The traditional architecture for generating sampled complex signals includes quadrature mixing followed by filter circuitry and sampling circuitry. Quadrature mixing is performed to break the input signal into a real path signal and an imaginary path signal. To generate the real path or in-phase signal, the input signal is mixed with a selected mixing signal. To generate the imaginary or quadrature path signal, the input signal is mixed with the same mixing signal shifted in phase by 90 degrees. This mixing operation, however, tends to introduce undesirable two-times (2x) images into the real and imaginary path signals. To eliminate these 2x images, filter circuitry, such as low pass filters, is often added to both the real and imaginary signal paths. Such filters may also provide some anti-aliasing for the analog-to-digital sampling. The real and imaginary signals are then sampled at the same sampling frequency to generate real and imaginary digital data streams. This traditional quadrature mixing sampling architecture suffers from various problems, including complexity and large size requirements, the introduction of undesired artifacts into the real and imaginary signal paths, and magnitude distortion of the real and imaginary signals at baseband.

SUMMARY OF THE INVENTION

In accordance with the present invention, quadrature sampling architecture and an associated method provide improved output signals over prior quadrature mixing implementations. Sampling circuitry according to the present invention samples an input signal with a first and second sampling signals to directly produce real and imaginary sampled output signals. The first sampling signal, which is associated with the real sampled output signal, is delayed by one-fourth cycle with respect to the second sampling signal, which is associated with the imaginary sampled output signal. This one-fourth cycle sampling signal difference allows for simplified construction of the sampling circuitry. In addition, filter circuitry according to the present invention processes the real and imaginary digital data output signals so that the imaginary digital data output signal is advanced by one-fourth cycle with respect to the real digital data output signal. This one-fourth cycle relative advance tends to eliminate undesirable magnitude distortion and errors in the digital output signals at baseband. Furthermore, the real and imaginary signal paths may be interchanged and still take advantage of the present invention.

DESCRIPTION OF THE PREFERRED EMBODIMENTS

Figure 1:
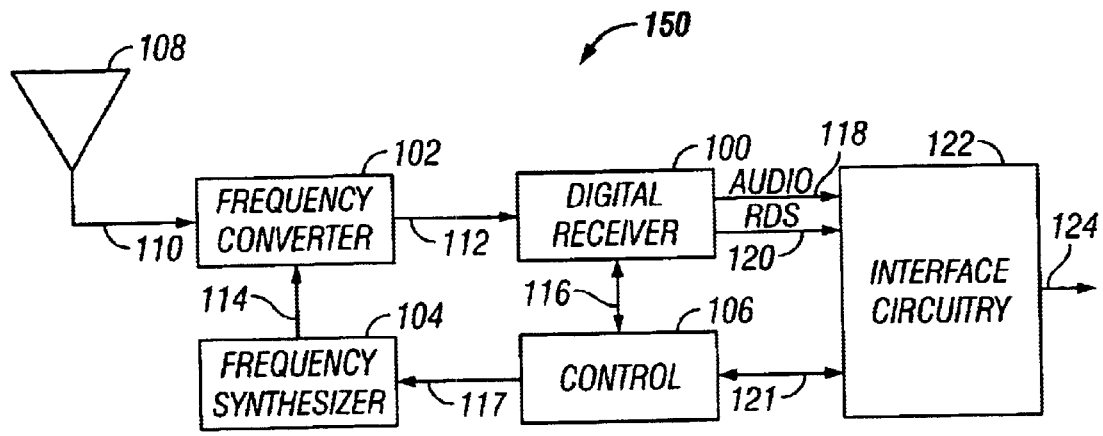
FIG. 1 is a block diagram of an embodiment for an intermediate frequency (IF) AM/FM radio receiver.

Referring now to FIG. 1, a block diagram is depicted for an embodiment of an intermediate frequency (IF) AM/FM radio receiver 150. Frequency converter circuitry 102 converts a radio frequency (RF) signal 110 received from the antenna 108 to an IF frequency 112. The frequency converter circuitry 102 utilizes a mixing signal 114 from a frequency synthesizer 104 to perform this conversion from the RF frequency range to the IF frequency range. Control circuitry 106 may apply a control signal 117 to frequency synthesizer 104 to choose the mixing signal 114 depending upon the station or channel that is desired to be received by the IF receiver 150. The digital receiver circuitry 100 processes the IF signal 112 and produces desired output signals, for example, audio output signals 118 and radio data system (RDS) output signals 120. These output signals may be provided to interface circuitry 122 and output to external devices through interface signals 124. The control circuitry 106 may communicate with the digital receiver circuitry 100 through signals 116 and may communicate with the interface circuitry 122 through signals 121. In addition, control circuitry 106 may communicate with external devices through the interface circuitry 122.

Figure 2:
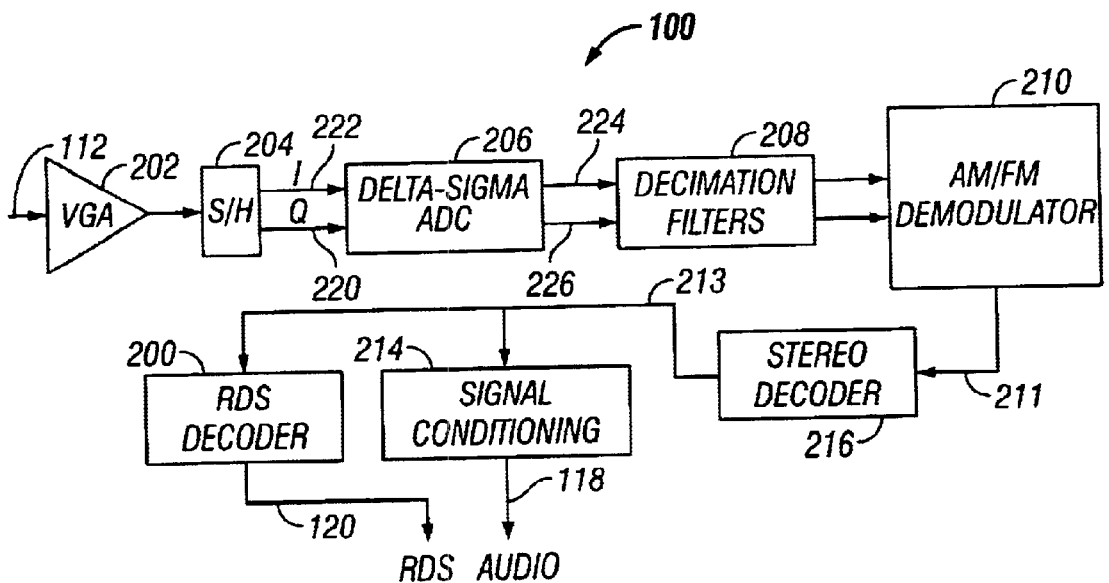
FIG. 2 is a block diagram of an embodiment for the digital receiver within the radio receiver.

FIG. 2 is a block diagram of an embodiment for the digital receiver 100. The IF input signal 112 is amplified by a variable gain amplifier (VGA) 202. The output of the variable gain amplifier (VGA) 202 may be filtered with anti-aliasing filters if desired. Sample-and-hold (S/H) circuitry 204 samples the resulting signal and produces an in-phase (real) output signal (I) 222 and a quadrature (imaginary) output signal (Q) 220. The S/H circuitry 204 may in some cases be commingled with the analog-to-digital converter (ADC) circuitry 206. The analog-to-digital converter (ADC) circuitry 206 processes the I and Q signals 222 and 220 to form an I digital signal 224 and a Q digital signal 226. The ADC circuitry 206 operates to convert the I and Q signals 222 and 220 to the one-bit digital I and Q data streams 224 and 226. The digital output of the ADC circuitry 206 is passed through digital decimation filters 208 to complete channelization of the signals. The decimation filters 208 may also remove quantization noise caused by ADC 206 and provide anti-aliasing filtering.

Demodulation of the decimated I and Q digital data signals may be performed by AM/FM demodulator 210. The demodulator 210 may include for example a CORDIC (COordinate Rotation DIgital Computer) processor that processes the digital I and Q data streams and outputs both the angle and magnitude of the I and Q digital data. For FM demodulation, the demodulator 210 may also perform discrete-time differentiation on the angle value outputs. Assuming the signals received are FM stereo signals, the output of the demodulator will be an FM multiplex spectrum signal 211. This FM multiplex signal 211 is then processed by stereo decoder 216 to decode the left and right channel information from the multiplexed stereo signal. The stereo decoder 216 may also provide additional signal processing as desired. Thus, the output signals 213 from the stereo decoder 216 may include, for example, a left channel (L) signal, a right channel (R) signal, a left-minus-right (L−R) signal, a left-plus-right (L+R) signal, and a 19 kHz pilot tone.

The signal conditioning circuitry 214 and the RDS decoder 200 receive signals 213 from the stereo decoder 216. It is noted that the signals received by the RDS decoder 200 and the signal conditioning circuitry 214 may be any of the signals produced by stereo decoder 216 and each may receive different signals from the other, as desired. The signal conditioning circuitry 214 may perform any desired signal processing, including for example detecting weak signal conditions, multi-path distortions and impulse noise and making appropriate modifications to the signals to compensate for these signal problems. The output of the signal conditioning circuitry 214 provides the desired audio output signals 118. The RDS decoder 200 recovers RDS data for example from a left-minus-right (L−R) signal available from the stereo decoder 216. The output of the RDS decoder 200 provides the desired RDS output signals 120, which may include RDS clock and data signal information.

Figure 3:
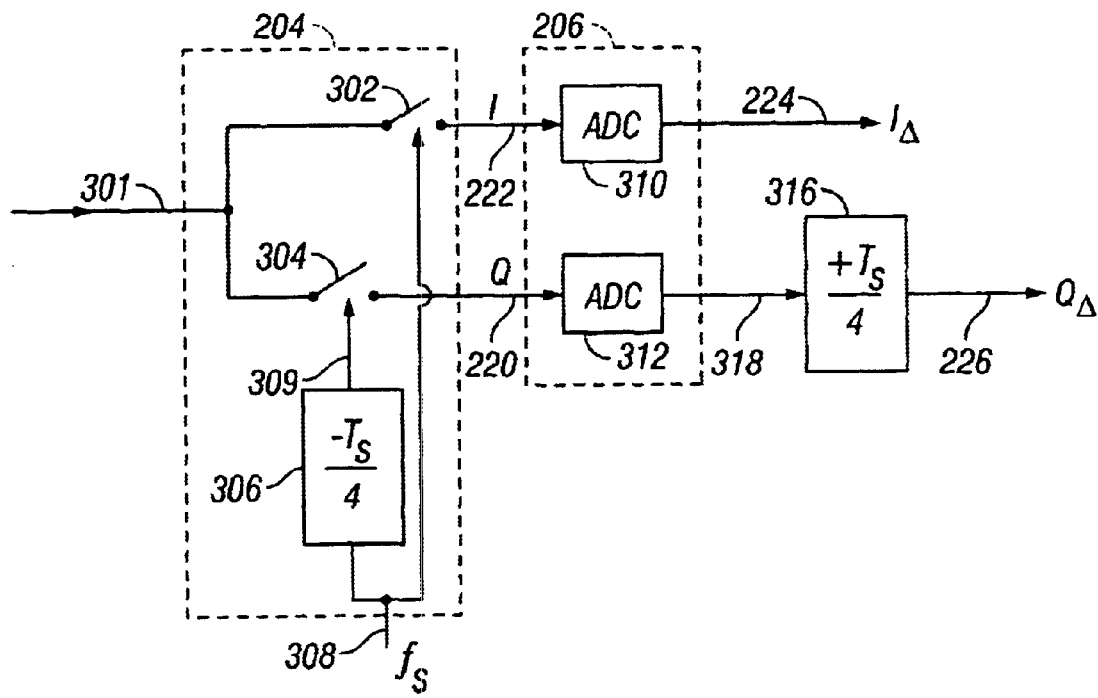
FIG. 3 is a block diagram of an embodiment for quadrature sampling architecture according to the present invention.

Referring now to FIG. 3, a block diagram is depicted of an embodiment for quadrature sampling architecture according to the present invention. The sample-and-hold (S/H) circuitry 204, which receives the output 301 from variable gain amplifier (VGA) 202, includes in-phase (real) path sampling circuitry 302 and quadrature (imaginary) path sampling circuitry 304. It is also noted that the gain scaling provided by the variable gain amplifier (VGA) 202 could be implemented within the delta-sigma ADCs 310 and 312, if desired.

The quadrature (imaginary) path sampling circuitry 304 is controlled by a timing signal 308. The timing signal 308 has a period ($T_s$) that is the inverse of a desired sampling frequency ($f_s$) such that $T_s=1/f_s$. The in-phase (real) path sampling circuitry 302 is controlled by the sampling signal 309. The timing signal 309 is generated by passing the timing signal 308 through a delay block 306 that delays the timing signal 308 by one-fourth cycle or $-T_s/4$. The sampling circuitry 302 produces the in-phase (real) signal (I) 222 that is provided to ADC circuitry 206. The sampling circuitry 304 produces the quadrature (imaginary) signal (Q) 220 that is provided to ADC circuitry 206 through delay block 315. Delay block 315 provides a one-fourth cycle or $-T_s/4$ delay to the imaginary path signal (Q) 220 to time align it with respect to the real path signal (I) 222.

The ADC circuitry 206 may include a real path ADC 310 and an imaginary path ADC 312. The ADCs 310 and 312 may be implemented in a variety of ways and may each be, for example, a fifth order low-pass delta-sigma ADC. The output signal from the real path ADC 310 is the in-phase digital signal ($I_D$) 224. The output signal 318 from the imaginary path ADC 312 is first passed through advance block 316 before becoming the quadrature digital signal (QD) 226. The advance block 316 advances the output signal 318 by one-fourth cycle or $+T_s/4$ relative to the in-phase signal ($I_D$) 224. This advancing of the output signal 318 from the imaginary path ADC 312 advantageously eliminates magnitude distortions and errors in the resulting combined real and imaginary output signals 224 and 226.

It is noted that the delay and advancement provided by the delay and advance blocks 306, 315 and 316 represent relative changes between the real and imaginary path signals. Thus, for example, the advancement provided by advance block 316 may be achieved by placing more delay in the real signal path than in the imaginary signal path. For example, a base delay block with a base delay ($T_o$) could be provided in both the real and imaginary signal paths and an additional delay ($T_{delta}$) could also be provided in the real signal path. The overall result would be that the imaginary signal path is advanced with respect to the real signal path by the additional delay ($T_{delta}$) that is in the real signal path. According to the present invention, this relative ($T_{delta}$) would be $T_s/4$ and the base delay ($T_o$) may be an amount of delay or zero delay, as desired. It is also noted that the advance block 316 may be accomplished using digital filters that provide the desired relative change to the imaginary path signal and that these digital filters may be part of the digital decimation filters 208, which follow the delta-sigma ADC 206, as depicted in FIG. 2. It is further noted that the functionality of the advance block 316 may be included within the ADC 206 itself.

The quadrature sampling architecture of the present invention does not require a mixer or a mixing signal to create the in-phase and quadrature signal paths, which are then each sampled at a desired sampling rate with the same sampling signal. Rather, sampled in-phase and quadrature signals are, directly generated by sampling the input signal with sampling signals that are shifted by one-fourth cycle with respect to each other. This implementation according to the present invention allows for simpler designs and smaller size requirements. In addition, the quadrature sampling architecture of the present invention tends to eliminate two-times (2x) components that are introduced by the mixing process, allowing for the elimination of anti-aliasing filters designed to remove these 2x components.

As shown in FIG. 3, the real input 301 is subjected to quadrature sampling through the use of delay block 306, and the resulting real and imaginary signals are then time aligned, for example, through the use of delay block 315 in the imaginary signal path. An equivalent result may be reached by phase-coherent sampling of real and imaginary signal paths in which the imaginary signal path has been created by initially delaying the real signal by one-fourth cycle. This is so because the one-fourth cycle or $-T_s/4$ delay may be moved through the quadrature sampling operation without changing the complex signal spectrum.

Figure 5:
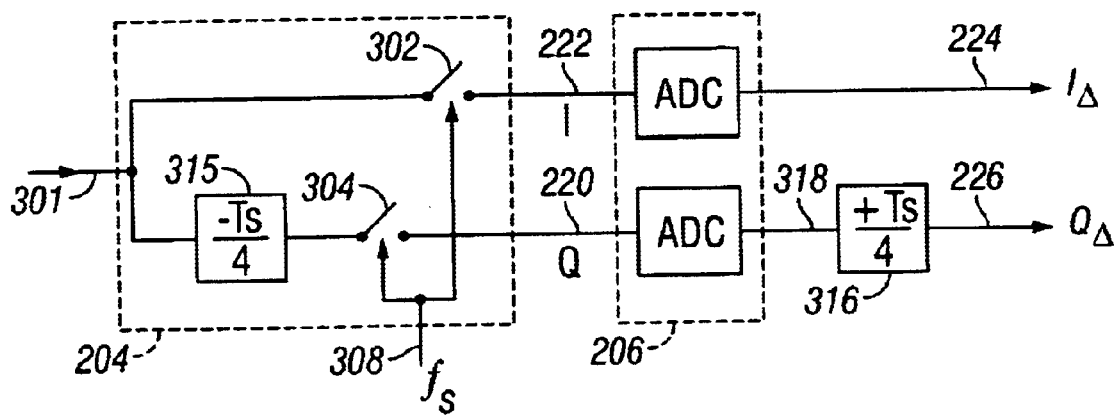
FIG. 5 is a block diagram of an equivalent conceptual implementation for the quadrature sampling architecture of FIG. 3.

FIG. 5 depicts this equivalent conceptual implementation of the embodiment of the present invention depicted in FIG. 3. As shown in FIG. 5, the delay block 315 in the imaginary signal path has been moved in front of imaginary path sampling circuitry 304. The real and imaginary path sampling circuitry 302 and 304 are controlled by the same sampling control signal ($f_s$) 308. The mathematical analysis below utilizes the conceptual implementation of FIG. 5 because it simplifies the mathematics. The more practical implementation is depicted in FIG. 3 because the time alignment provided by delay block 315 becomes a convention of how to pair the real and imaginary samples and because it is often easier to delay the sampling control signal rather than the actual input signal.

The following steps provide an analysis of how the quadrature sampling architecture of the present invention operates to provide a desired complex baseband output signal. The input signal 301, which is the input signal for both the real and imaginary signal paths, is assumed to be $I_{input}=Q_{input}=A(f-f_c)+A^*(-f+f_c)$, where "f" represents frequency, "$f_c$" represents the center frequency, "A" represents the positive frequency spectrum, and "A*" represents the complex conjugate of the positive frequency spectrum centered at $-f_c$. Assuming that the sampling frequency ($f_s$) is chosen such that $f_s=f_c$, the real output signal sampled at the sampling frequency ($f_s$) will be $I_{output}=A(f)+A^*(-f)$. The desired complex baseband signal is assumed to be $I_{output}+jQ_{output}=A(f)$. The analysis of delaying the real input signal by $T_s/4$ to generate a complex path signal ($Q_D$) 226 is now shown.

1. Delaying signal by $T_s/4$    $[A(f-f_c)+A^*(-f+f_c)]e^{-j(2\pi f)/4fs}$
2. Sampling at $f_s = f_c$    $A(f)e^{-j2\pi(f+fc)/4fc} + A^*(-f)\,e^{-j2\pi(f-fc)/4fc}$
3. Advancing by T/4    $[A(f)e^{-j2\pi(f+fc)/4fc} + A^*(-f)\,e^{-j2\pi(f-fc)/4fc}]e^{j2\pi f/4fc}$
     $A(f)e^{-j\pi/2} + A^*(-f)\,e^{j\pi/2}$
     $-jA(f) + jA^*(-f) = Q_{output}$
4. Combining $I_{output}+jQ_{output}$    $I_{output} + jQ_{output} = [A(f)+A^*(-f)]+j[-jA(f)+jA^*(-f)]$
     $I_{output} + jQ_{output} = A(f)+A^*(-f)+A(f)-A^*(-f)$
     $I_{output} + jQ_{output} = 2A(f)$ Thus, by sampling the real path input signal with a timing signal delayed by $T_s/4$, by delaying the imaginary path signal (Q) 220 by $T_s/4$, by then advancing the imaginary signal path by $T_s/4$, and by finally combining this imaginary sampled signal with a real path sampled signal, a result is achieved that provides an output that is two-times the desired complex baseband signal.

It is noted that at the ADC 206, the present invention provides equivalent data as is provided by the traditional implementation of quadrature mixing followed by sampling both the real and imaginary signal paths with the same timing signal. In other words, the present invention may be used instead of prior quadrature mixing implementations without significant alterations to other portions of the circuitry. However, unlike these prior quadrature mixing implementations, the present invention also advantageously eliminates magnitude distortion and errors at baseband that is suffered by prior implementations.

Significantly, the one-fourth cycle or $+T_s/4$ advance provided by advance block 316 tends to eliminate magnitude distortion and errors at baseband that is experienced by prior implementations. As may be seen in step 3 above, this delay simplifies the imaginary output terms to $-jA(f)+jA^*(-f)$. Without this relative advance, the combination of the imaginary and real signal paths as indicated in step 4 above would result in an additional magnitude distortion term X(f) multiplied by the 2A(f) output, as well as an additive error term of E(f) multiplied by $A^*(-f)$. For frequencies very near baseband (i.e., $f \approx 0$ Hz), the magnitude distortion term would be near unity, and the additive error term would be small, such that the output is essentially 2A(f). However, for frequencies further from baseband, these terms cause undesirable magnitude distortion and errors in the output signal.

It is noted that the technique of advancing the output signal 318 from the imaginary path ADC 312 by one-fourth cycle or $+T_s/4$ may be implemented by folding this delay into the circuitry for the ADC 312 itself. In addition, this advance block 316 could be utilized with prior quadrature mixing implementations to eliminate magnitude distortion and errors. As indicated above, the S/H circuitry 204 according to the present invention provides data points to the ADC 206 that are equivalent to data points that prior quadrature mixing implementations would provide to the ADC 206. Thus, although the S/H circuitry 204 of the present invention has advantages over prior quadrature mixing implementations, the advantageous advance block 316 could be utilized whether or not the S/H circuitry of the present invention is utilized.

It is also noted that for the above analysis, the sampling frequency ($f_s$) was chosen to be equal to $f_c$. This analysis will also hold true for conditions where the sampling frequency is selected so that $f_s=f_c/(2n+1)$, where $n=0,\pm1,\pm2,\ldots$.

Figure 4:
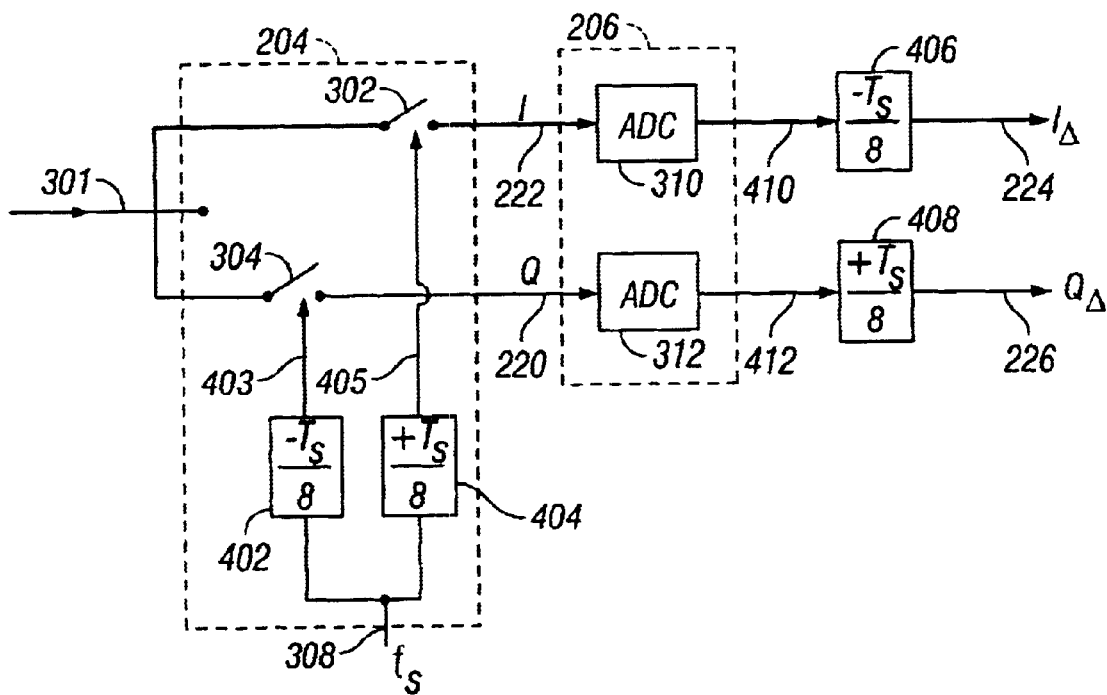
FIG. 4 is a block diagram of an alternative embodiment for quadrature sampling architecture according to the present invention.

FIG. 4 is a block diagram of an alternative embodiment for quadrature sampling architecture according to the present invention showing a different way of achieving a relative difference between the real and imaginary signal paths. As with the embodiment depicted in FIG. 3, the sample-and-hold (S/H) circuitry 204, which receives the output 301 from variable gain amplifier (VGA) 202, includes in-phase (real) path sampling circuitry 302 and quadrature (imaginary) path sampling circuitry 304. Also, as with the embodiment of FIG. 3, the ADC circuitry 206 may include a real path ADC 310 and an imaginary path ADC 312. Different from FIG. 3, however, are the timing signals controlling sampling circuitry 302 and 304, the time alignment circuitry provided by blocks 407 and 409, and the circuitry coupled to the output of ADCs 310 and 312.

The sampling circuitry 302 produces the in-phase (real) signal (I) 222 that is provided to ADC circuitry 206 through advance block 407. The sampling circuitry 304 still produces the quadrature (imaginary) signal (Q) 220 that is provided to ADC circuitry 206 through delay block 409. Delay block 409 delays the imaginary path signal (Q) 220 by a one-eighth cycle or $-T_s/8$, and advance block 407 advances the real path signal (I) 222 by one-eighth cycle or $+T_s/8$. Blocks 407 and 409 act together to time align the imaginary path signal (I) 222 and the real path signal (I) 222 by providing an overall relative delay of one-fourth cycle or $-T_s/4$.

The in-phase (real) path sampling circuitry 302 is controlled by a timing signal 405, and the quadrature (imaginary) path sampling circuitry 304 is controlled by the sampling signal 403. The timing signal 405 is produced by passing the timing signal 308 of period $T_s$ through a delay block 404 that delays the timing signal 308 by one-eighth cycle or $-T_s/8$. The timing signal 403 is produced by passing the timing signal 308 through an advance block 402 that advances the timing signal 308 by one-eighth cycle or $+T_s/8$. The advance of the imaginary path timing signal 403 by $+T_s/8$ and the delay of the real path timing signal 405 by $-T_s/8$ combine to provide that the real path sampling circuitry 302 is sampled at a time that is delayed by one-fourth cycle or $-T_s/4$ relative to the imaginary path sampling circuitry 304.

To produce the in-phase (real) digital signal ($I_D$) 224, the output signal 410 from the real path ADC 310 is passed through delay block 406. The delay block 406 delays the output signal 410 by one-eighth cycle or $-T_s/8$ to compensate for the $+T_s/8$ advance introduced by the advance block 407. To produce the quadrature (imaginary) digital signal (QD) 224, the output signal 412 from the imaginary path ADC 312 is passed through advance block 408. The advance block 408 advances the output signal 412 by one-eighth cycle or $+T_s/8$ to compensate for the $-T_s/8$ delay introduced by the delay block 409. The advance of the imaginary path digital signal 412 by $+T_s/8$ and the delay of the real path digital signal 410 by $-T_s/8$ combine to provide that the imaginary path digital output signal 226 is advance by one-fourth cycle with respect to the real path digital output signal 224.

As with the embodiment of FIG. 3, it is noted that the delay block 406 and the advance block 408 may be digital filters that provide the desired changes to the real and imaginary path signals and that these digital filters may be part of the digital decimation filters 208, which follow the delta-sigma ADC 206, as depicted in FIG. 2. In addition, as also indicated above, these digital filters may be included within the ADC 206 itself.

It is again noted that the delay and advance blocks 402, 404, 406, 407, 408 and 409 represent relative phase differences. Thus, the real path timing signal 405 is delayed by one-fourth cycle with respect to the imaginary path timing signal 403. The imaginary path signal (Q) 220 is delayed by one-fourth cycle with respect to the real path signal (I) 222. And, the real path digital output signal 224 is delayed by one-fourth cycle with respect to the imaginary path digital output signal 226. As indicated above, these relative delays may be implemented by providing some base delay in both signal paths and then adjusting this base delay to achieve the desired relative difference. The $+T_s/8$ and $-T_s/8$ indications, therefore, may be thought of as modifications to such a base delay.

It is noted that above description has been provided with one orientation for the real and imaginary signals in the complex system. The real and imaginary designations could be swapped in the above description and in the drawings and still take advantage of the current invention. This swapping would provide for a different but equally effective orientation for the real and imaginary signals in a complex system. For example, the relative advancement represented by advance block 316 in FIG. 3 would be in the real digital data output signal path and not in the imaginary digital data output signal path.

What is claimed is:

1. A system for quadrature sampling input signals to produce complex digital data output signals, comprising:
   sampling circuitry coupled to an input signal and having real and imaginary sampled output signals;
   analog-to-digital converter circuitry coupled to the real and imaginary sampled output signals and having real and imaginary digital data output signals; and
   filter circuitry coupled to the real and imaginary digital data output signals to provide a relative delay between the real and imaginary digital data output signals of one-fourth cycle.

2. The system of claim 1, wherein the imaginary digital data output signal is advanced by one-fourth cycle relative to the real digital data output signal.

3. The system of claim 2, wherein the analog-to-digital converter circuitry comprises delta-sigma analog-to-digital converter circuitry.

4. The system of claim 3, wherein the filter circuitry is included within the analog-to-digital converter circuitry.

5. The system of claim 4, wherein the analog-to-digital converter circuitry comprises a real path delta-sigma analog-to-digital converter and an imaginary path delta-sigma analog-to-digital converter.

6. The system of claim 2, wherein the real sampled output signal is sampled with a signal having a phase that is delayed by one-fourth cycle with respect to a phase for a signal with which the imaginary output signal is sampled.

7. The system of claim 6, wherein delay circuitry is coupled to delay the imaginary sampled output signal by one-fourth cycle with respect to the real sampled output signal.

8. The system of claim 6, wherein the real path sampling circuitry is controlled by a first sampling signal that is delayed by one-eighth cycle with respect to a base sampling signal and the imaginary sampling circuitry is controlled by a second sampling signal that is advanced by one-eighth cycle with respect to a base sampling signal.

9. The system of claim 2, wherein the filter circuitry comprises digital filter circuitry.

10. The system of claim 9, wherein the filter circuitry comprises a first digital filter located within a signal path for the real digital data output signal and a second digital filter located within a signal path for the imaginary digital data output signal.

11. The system of claim 1, where the real digital data output signal is advanced by one-fourth cycle relative to the imaginary digital data output signal.

12. Quadrature sampling circuitry, comprising:
    real path sampling circuitry coupled to an input signal and being controlled by a first sampling signal; and
    imaginary path sampling circuitry coupled to the input signal and being controlled by a second sampling signal,
    wherein the first sampling signal and the second sampling signal have a relative delay between them of one-fourth cycle.

13. The quadrature sampling circuitry of claim 12, wherein the first sampling circuitry is delayed with respect to the second sampling signal by one-fourth cycle.

14. The quadrature sampling circuitry of claim 13, wherein the first sampling signal is delayed by one-eighth cycle with respect to a base sampling signal and the second sampling signal is advanced by one-eighth cycle with respect to a base sampling signal.

15. The quadrature sampling circuitry of claim 13, further comprising delay circuitry coupled to delay the imaginary sampled output signal by one-fourth cycle with respect to the real sampled output signal.

16. The quadrature sampling circuitry of claim 12, wherein the second sampling circuitry is delayed with respect to the first sampling signal by one-fourth cycle.

17. A method for quadrature sampling of input signals to produce complex digital data output signals, comprising:
    receiving an input signal;
    sampling the input signal to produce a real sampled signal and an imaginary sampled signal;

converting the real and imaginary sampled signals to real and imaginary digital data output signals; and processing the real and imaginary digital data output signals to provide a relative delay between the real and imaginary digital data output signals of one-fourth cycle.

18. The method of claim 17, wherein the processing step advances the imaginary digital 13 data output signal by one-fourth cycle relative to the real digital data output signal.

19. The method of claim 18, wherein the sampling step comprises sampling the input signal at a first sampling signal to produce a real sampled signal and sampling the input signal at a second sampling signal to produce an imaginary sampled signal, the first sampling signal being delayed with respect to the second sampling signal by one-fourth cycle.

20. The method of claim 18, further comprising processing said real and imaginary sampled signals to delay the imaginary sampled signal by one-fourth cycle with respect to the real sampled signal prior to the converting step.

21. The method of claim 18, wherein the first sampling signal is delayed by one-eighth cycle with respect to a base sampling signal and the second sampling signal is advanced by one-eighth cycle with respect to a base sampling signal.

22. The method of claim 18, wherein the processing step comprises filtering the real digital data output signal path to delay the real digital data output signal by one-eighth cycle with respect to a base delay and filtering the imaginary digital data output signal path to advance the imaginary digital data output signal by one-eighth cycle with respect to a base delay.

* * * * *